United States Patent
Zhang et al.

(10) Patent No.: US 10,580,806 B2
(45) Date of Patent: Mar. 3, 2020

(54) METHOD OF MANUFACTURING A DISPLAY SUBSTRATE, METHOD OF MANUFACTURING A DISPLAY DEVICE AND DISPLAY SUBSTRATE

(71) Applicants: BOE TECHNOLOGY GROUP CO., LTD., Beijing (CN); BEIJING BOE DISPLAY TECHNOLOGY CO., LTD., Beijing (CN)

(72) Inventors: Xiaoxiang Zhang, Beijing (CN); Huibin Guo, Beijing (CN); Mingxuan Liu, Beijing (CN); Zhichao Zhang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/566,196

(22) PCT Filed: Mar. 10, 2017

(86) PCT No.: PCT/CN2017/076259
§ 371 (c)(1),
(2) Date: Oct. 12, 2017

(87) PCT Pub. No.: WO2018/032753
PCT Pub. Date: Feb. 22, 2018

(65) Prior Publication Data
US 2019/0165005 A1    May 30, 2019

(30) Foreign Application Priority Data
Aug. 15, 2016 (CN) .......................... 2016 1 0666962

(51) Int. Cl.
*H01L 27/12* (2006.01)
*H01L 29/786* (2006.01)

(52) U.S. Cl.
CPC ........ *H01L 27/1259* (2013.01); *H01L 27/124* (2013.01); *H01L 29/78669* (2013.01)

(58) Field of Classification Search
CPC ... H01L 27/1259; H01L 27/124; H01L 21/77; H01L 27/12
See application file for complete search history.

(56) References Cited

U.S. PATENT DOCUMENTS

2005/0112303 A1    5/2005   Kim et al.
2006/0188697 A1    8/2006   Lee
(Continued)

FOREIGN PATENT DOCUMENTS

CN    1622722 A    6/2005
CN    1838843 A    9/2006
(Continued)

OTHER PUBLICATIONS

Office Action received for Chinese Patent Application No. 2016 1 0666962.X, dated Feb. 19, 2019, 18 pages (10 pages of English Translation and 8 pages of Office Action).
(Continued)

*Primary Examiner* — Anthony Ho
(74) *Attorney, Agent, or Firm* — Womble Bond Dickinson (US) LLP

(57) ABSTRACT

There are provided a method of manufacturing a display substrate, a method of manufacturing a display device, and a display substrate. The method of manufacturing a display substrate comprises: providing a base substrate; forming a thin film transistor on the base substrate; forming a first conductive layer on the base substrate on which the thin film transistor is formed, the first conductive layer being electri-
(Continued)

cally connected to a drain of the thin film transistor; forming a light-emitting material block; and transferring the light-emitting material block to a surface of the first conductive layer.

13 Claims, 4 Drawing Sheets

(56) References Cited

U.S. PATENT DOCUMENTS

| | | | |
|---|---|---|---|
| 2011/0234550 | A1 | 9/2011 | Hong et al. |
| 2013/0306943 | A1 | 11/2013 | Kato et al. |
| 2014/0021459 | A1 | 1/2014 | Yamazaki et al. |
| 2015/0102343 | A1* | 4/2015 | Park ............ H01L 27/124 257/43 |
| 2016/0035804 | A1 | 2/2016 | Cheng et al. |

FOREIGN PATENT DOCUMENTS

| | | |
|---|---|---|
| CN | 102201430 A | 9/2011 |
| CN | 103189463 A | 7/2013 |
| CN | 103474578 A | 12/2013 |
| CN | 203674211 U | 6/2014 |
| CN | 104752467 A | 7/2015 |
| CN | 106206427 A | 12/2016 |
| JP | 2005-310410 A | 11/2005 |
| KR | 10-0762686 B1 | 10/2007 |

OTHER PUBLICATIONS

International Preliminary Report on Patentability received for PCT Patent Application No. PCT/CN2017/076259, dated Feb. 28, 2019, 11 pages (6 pages of English Translation and 5 pages of Original Document).
International Search Report and Written Opinion in PCT/CN2017/076259 dated Jun. 14, 2017, with English translation.
Office Action received for Chinese Patent Application No. 201610666962.X, dated Aug. 1, 2018, 16 pages (8 pages of English Translation and 8 pages of Office Action).

* cited by examiner

METHOD OF MANUFACTURING A DISPLAY SUBSTRATE, METHOD OF MANUFACTURING A DISPLAY DEVICE AND DISPLAY SUBSTRATE

RELATED APPLICATION

The present application is the U.S. national phase entry of PCT/CN2017/076259, with an international filing date of Mar. 10, 2017, which claims the benefit of Chinese Patent Application No. 201610666962.X, filed on Aug. 15, 2016, the entire disclosure of which is incorporated herein by reference.

FIELD

The present invention relates to the field of display technology, and particularly to a method of manufacturing a display substrate, a method of manufacturing a display device, and a display substrate.

BACKGROUND

The manufacturing process of a thin film transistor liquid crystal display (TFT-LCD) is complicated, which includes the procedures such as manufacturing an array substrate, manufacturing a color film substrate, performing cell alignment, and so on, resulting in a long manufacturing period. A light-emitting diode (LED), especially an organic light emitting diode (OLED), is a thin film electroluminescent device, which has the advantages including simple preparation process, low cost, high luminous efficiency, being easy to form a flexible structure, and the like. Therefore, the display technology that utilizes a light-emitting diode or an organic light-emitting diode has become an important display technology.

SUMMARY

In view of this, embodiments of the present invention propose a method of manufacturing a display substrate, a method of manufacturing a display device, and a display substrate, which decrease the process steps and improve the display quality.

According to an aspect of the present invention, an embodiment of the present invention provides a method of manufacturing a display substrate. The method of manufacturing a display substrate comprises: providing a base substrate; forming a thin film transistor on the base substrate; forming a first conductive layer on the base substrate on which the thin film transistor is formed, the first conductive layer being electrically connected to a drain of the thin film transistor; forming a light-emitting material block; and transferring the light-emitting material block to a surface of the first conductive layer.

In the method of manufacturing a display substrate according to an embodiment of the present invention, the formed light-emitting material block is transferred to the surface of the first conductive layer, so that a display substrate having a light-emitting material layer can be obtained using the base substrate on which the thin film transistor is formed without the need for a photolithographic process such as patterning, thereby saving the process steps. In the prior art, since the light-emitting material is usually formed directly on the base substrate, it is difficult to obtain a light-emitting material block having desired dimension and composition due to the limitation by the process conditions such as temperature. According to embodiments of the present invention, the light-emitting material block can be formed separately so that the dimension (e.g. area, thickness) and the composition of the light-emitting material block can be adjusted as necessary without the above limitation, thereby improving the display quality.

Optionally, the step of forming a light-emitting material block comprises: forming a light-emitting material block on a wafer.

By forming the light-emitting material block on the wafer, a desired light-emitting material block can be obtained with precise process conditions. It will be understood by those skilled in the art that the light-emitting material block may be formed on the wafer using a photolithographic process.

Optionally, the step of forming a light-emitting material block further comprises: singulating the light-emitting material block.

By singulating the light-emitting material block, the light-emitting material blocks can be transferred to the surface of the conductive layer in accordance with a predetermined arrangement order.

Optionally, the step of transferring the light-emitting material block to a surface of the first conductive layer comprises picking up the light-emitting material block and bonding the light-emitting material block to the surface of the first conductive layer.

The light-emitting material block can be precisely bonded to the surface of the conductive layer using a high-accuracy pick-up machine to achieve a desired resolution.

Optionally, the step of bonding the light-emitting material block to the surface of the first conductive layer comprises coating a conductive adhesive to a surface of the light-emitting material block or to the surface of the first conductive layer, and attaching the light-emitting material block to the surface of the first conductive layer.

The light-emitting material block may be directly placed on the surface of the conductive layer to form an electrical connection. In order to achieve a better electrical contact, the conductive adhesive may also be coated to a surface of the light-emitting material block or the surface of the conductive layer, so that the light-emitting material block is attached to the surface of the conductive layer.

Optionally, the light-emitting material block includes at least a light-emitting material block for emitting red light, a light-emitting material block for emitting green light, and a light-emitting material block for emitting blue light.

With the red light, green light and blue light, color display can be realized. Similarly, light-emitting material blocks for emitting light of other colors may be further used to achieve more color combinations.

Optionally, the step of forming a thin film transistor on the base substrate comprises: forming a gate line and a gate on the base substrate; forming, on the gate line and the gate, an insulating layer, an amorphous silicon layer, a data line, a source and a drain, successively; and forming a passivation layer. Alternatively, the step of forming a thin film transistor on the base substrate comprises: forming a data line, a source and a drain on the base substrate; forming, on the data line, the source and the drain, an insulating layer, an amorphous silicon layer, a gate line and a gate, successively; and forming a passivation layer.

The above elements may be formed using a photolithographic process, thereby forming a thin film transistor, which will not be limited in the present invention.

According to another aspect of the present invention, an embodiment of the present invention provides a method of manufacturing a display device. The method of manufacturing a display device comprises: the method of manufacturing a display substrate as described in the above embodiment, and forming a second conductive layer on a surface of the light-emitting material block facing away from the first conductive layer.

In the method of manufacturing a display device according to an embodiment of the present invention, the formed light-emitting material block is transferred to the surface of the first conductive layer so that a display substrate having a light-emitting material layer can be obtained using the base substrate on which the thin film transistor is formed without the need for a photolithographic process such as patterning, thereby saving the process steps. An adjustable voltage can be applied to the light-emitting material block via the first conductive layer and the second conductive layer, thereby achieving adjustable light emission and display.

Optionally, after forming a second conductive layer on a surface of the light-emitting material block facing away from the first conductive layer, the method further comprises packaging the display substrate.

The display substrate may be packaged with a material such as a transparent packaging layer, thereby preventing the light-emitting material block from being eroded by oxygen and water.

According to yet another aspect of the present invention, an embodiment of the present invention provides a display substrate. The display substrate comprises: a base substrate; a plurality of gate lines and a plurality of data lines formed on the base substrate, the plurality of gate lines and the plurality of data lines defining a plurality of pixels, wherein each of the pixels comprises a thin film transistor, a first conductive layer and a light-emitting material block. A gate of the thin film transistor is electrically connected to the gate line, a source of the thin film transistor is electrically connected to the data line, and a drain of the thin film transistor is electrically connected to the first conductive layer. The light-emitting material block is located on a surface of the first conductive layer.

In the prior art, since the light-emitting material is usually formed directly on the base substrate, it is difficult to obtain a light-emitting material block having desired dimension and composition due to the limitation by the process conditions such as temperature. According to embodiments of the present invention, the light-emitting material block can be formed separately so that the dimension (e.g. area, thickness) and composition of the light-emitting material block can be adjusted as necessary without the above limitation, thereby improving the display quality.

DETAILED DESCRIPTION

Technical solutions in embodiments of the present invention will be described below in a clear and complete manner with reference to the accompanying drawings in the embodiments of the present invention. Apparently, the described embodiments are merely part of the embodiments of the present invention, rather than all of them. All other embodiments obtained by those ordinarily skilled in the art based on the embodiments of the present invention without spending inventive efforts are within the scope of the present invention.

Figure 1:
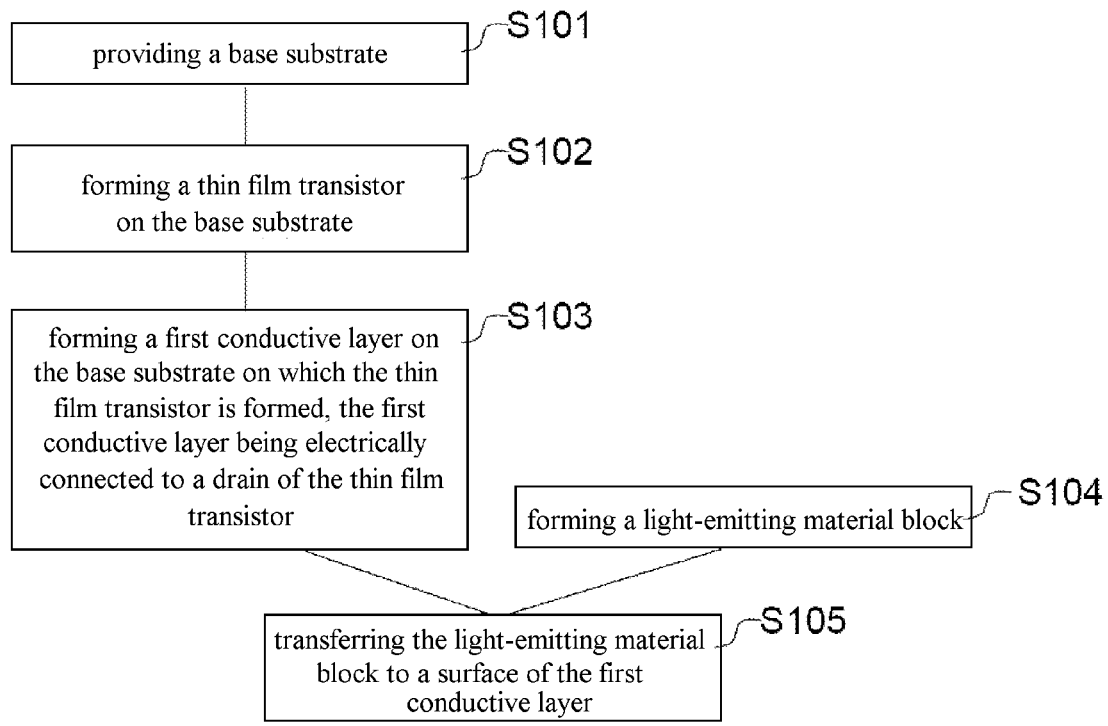
FIG. 1 illustrates a flow chart showing a method of manufacturing a display substrate according to an embodiment of the present invention.
Figure 2A:
FIGS. 2a-2e illustrate schematic views of the steps of the method of manufacturing a display substrate according to an embodiment of the present invention.
Figure 2B:
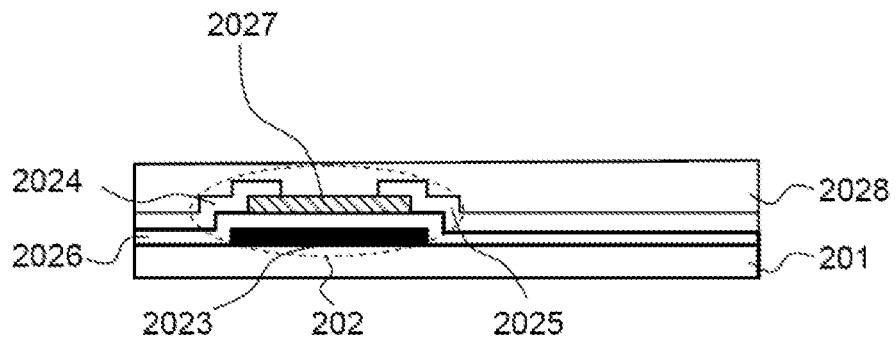
Figure 2C:
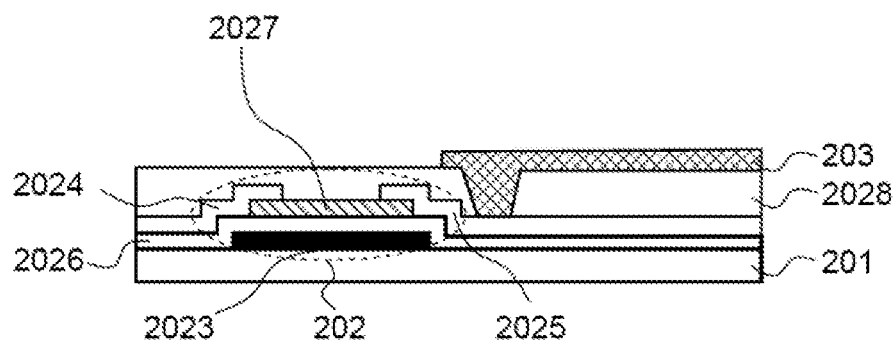
Figure 2D:
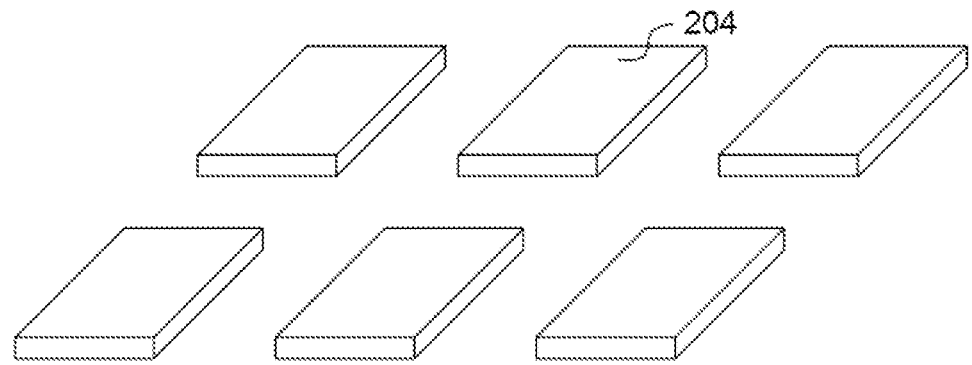
Figure 2E:
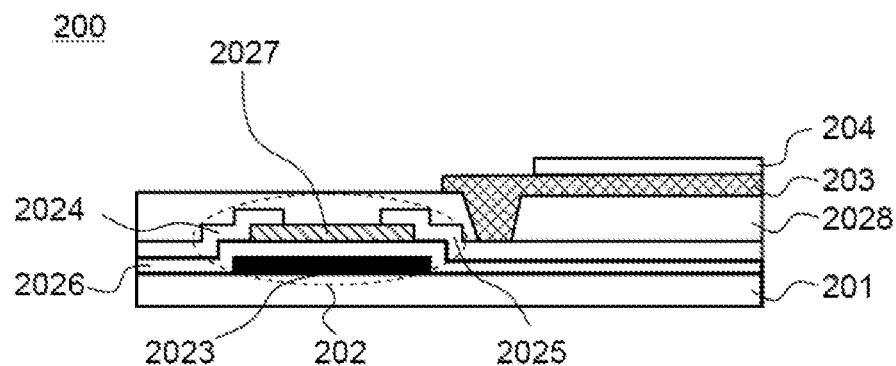

According to an aspect of the present invention, an embodiment of the present invention provides a method of manufacturing a display substrate. FIG. 1 shows a flow chart of a method of manufacturing a display substrate according to an embodiment of the present invention. As shown in FIG. 1, the method 100 of manufacturing a display substrate comprises: S101, providing a base substrate 201 (shown in FIG. 2a); S102, forming a thin film transistor 202 on the base substrate 201 (as shown in FIG. 2b, the thin film transistor 202 comprises a gate 2023, a source 2024, a drain 2025, an insulating layer 2026, and an amorphous silicon layer 2027); S103, forming a first conductive layer 203 on the base substrate 201 on which the thin film transistor 202 is formed, the first conductive layer 203 being electrically connected to the drain 2025 of the thin film transistor 202 (as shown in FIG. 2c); S104, forming a light-emitting material block 204 (shown in FIG. 2d); and S105, transferring the light-emitting material block 204 to a surface of the first conductive layer 203 (as shown in FIG. 2e).

In the method of manufacturing a display substrate according to an embodiment of the present invention, the formed light-emitting material block is transferred to the surface of the first conductive layer, so that a display substrate having a light-emitting material layer can be obtained using the base substrate on which the thin film transistor is formed without the need for a photolithographic process such as patterning, thereby saving the process steps. In the prior art, since the light-emitting material is usually formed directly on the base substrate, it is difficult to obtain a light-emitting material block having desired dimension and composition due to the limitation by the process conditions such as temperature. According to embodiments of the present invention, the light-emitting material block can be formed separately so that the dimension (e.g. area, thickness) and the composition of the light-emitting material block can be adjusted as necessary without the above limitation, thereby improving the display quality.

Figure 3:
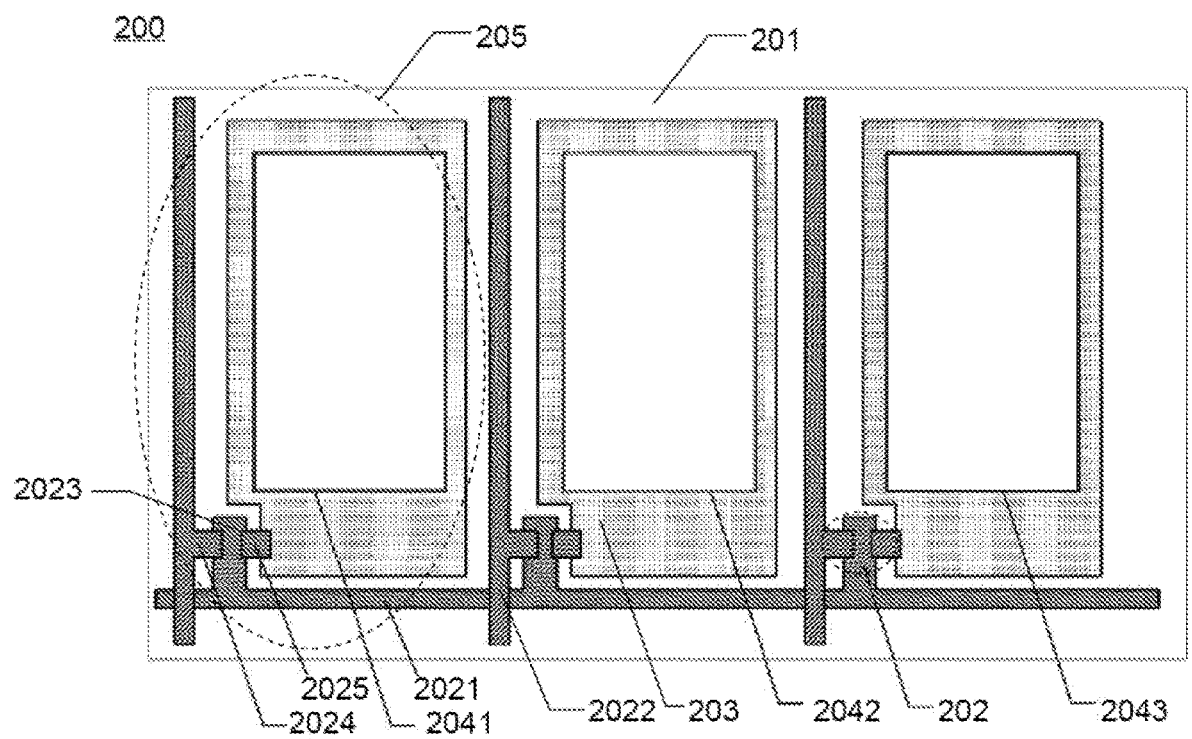
FIG. 3 illustrates a partial top view of a display substrate manufactured by the method of manufacturing a display substrate according to an embodiment of the present invention.

FIG. 3 shows a partial top view of a display substrate 200 manufactured by the method of manufacturing a display substrate according to an embodiment of the present invention. In this embodiment, a light-emitting material block 2041 for emitting red light, a light-emitting material block 2042 for emitting green light, and a light-emitting material block 2043 for emitting blue light are bonded to the surface of the first conductive layer 203. The first conductive layer 203 may be made of metal or ITO. The display substrate 200 comprises a base substrate 201, and a plurality of gate lines 2021 and a plurality of data lines 2022 formed on the base substrate 201. The plurality of gate lines 2021 and the plurality of data lines 2022 define a plurality of pixels 205, wherein each of the pixels 205 comprises a thin film transistor 202, a first conductive layer 203, and light-emitting material blocks 2041, 2042, 2043. The gate 2023 of the thin film transistor 202 is electrically connected to the gate line 2021, the source 2024 of the thin film transistor 202 is electrically connected to the data line 2022, and the drain 2025 of the thin film transistor 202 is electrically connected to the first conductive layer 203. The light-emitting material blocks 2041, 2042, 2043 are located on the surface of the first conductive layer 203.

Figure 4:
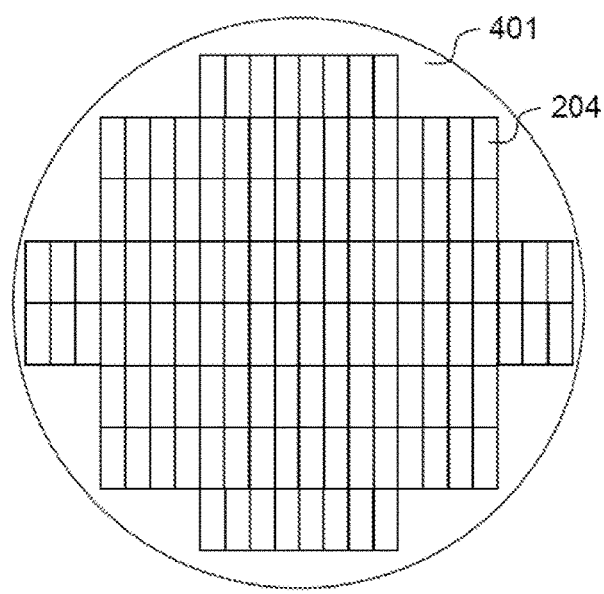
FIG. 4 illustrates forming a light-emitting material block on a wafer.

Optionally, as shown in FIG. 4, the step of forming a light-emitting material block comprises: forming a light-emitting material block 204 on a wafer 401.

By forming the light-emitting material block on the wafer, a desired light-emitting material block can be obtained with precise process conditions. It will be understood by those skilled in the art that the light-emitting material block may be formed on the wafer using a photolithographic process.

Optionally, the step of forming a light-emitting material block further comprises: singulating the light-emitting material block 204.

By singulating the light-emitting material block, the light-emitting material blocks can be transferred to the surface of the conductive layer in accordance with a predetermined arrangement order.

Optionally, the step of transferring the light-emitting material block to a surface of the first conductive layer comprises picking up the light-emitting material block 204 and bonding the light-emitting material block 204 to the surface of the first conductive layer 203.

The light-emitting material block can be precisely bonded to the surface of the conductive layer using a high-accuracy pick-up machine, thereby achieving a desired resolution.

Optionally, the step of bonding the light-emitting material block to the surface of the first conductive layer comprises coating a conductive adhesive to a surface of the light-emitting material block 204 or the surface of the first conductive layer 203, and attaching the light-emitting material block 204 to the surface of the first conductive layer 203.

The light-emitting material block may be directly placed on the surface of the conductive layer to form an electrical connection. In order to form a better electrical contact, the conductive adhesive may also be coated to the surface of the light-emitting material block or the surface of the conductive layer, so that the light-emitting material block is attached to the surface of the conductive layer.

Optionally, as shown in FIG. 3, the light-emitting material block 204 includes at least a light-emitting material block 2041 for emitting red light, a light-emitting material block 2042 for emitting green light, and a light-emitting material block 2043 for emitting blue light.

With red light, green light and blue light, color display can be realized. Similarly, light-emitting material blocks for emitting light of other colors may be further used to achieve more color combinations.

Optionally, as shown in FIGS. 2b and 3, the step of forming a thin film transistor on the base substrate comprises: forming a gate line 2021 and a gate 2023 on the base substrate 201, forming, on the gate line 2021 and the gate 2023, an insulating layer 2026, an amorphous silicon layer 2027, a data line 2022, a source 2024 and a drain electrode 2025, successively, and forming a passivation layer 2028. It will be understood by those skilled in the art that the thin film transistor formed in the manner described above is a bottom gate type thin film transistor.

Similarly, the thin film transistor may also be a top gate type thin film transistor. Therefore, alternatively, the step of forming a thin film transistor on the base substrate comprises: forming a data line, a source and a drain on the base substrate, forming, on the data line, the source and the drain, an insulating layer, an amorphous silicon layer, a gate line and a gate, successively, and forming a passivation layer.

The above elements may be formed using a photolithographic process, thereby forming a thin film transistor, which will not be limited in the present invention.

Figure 5:
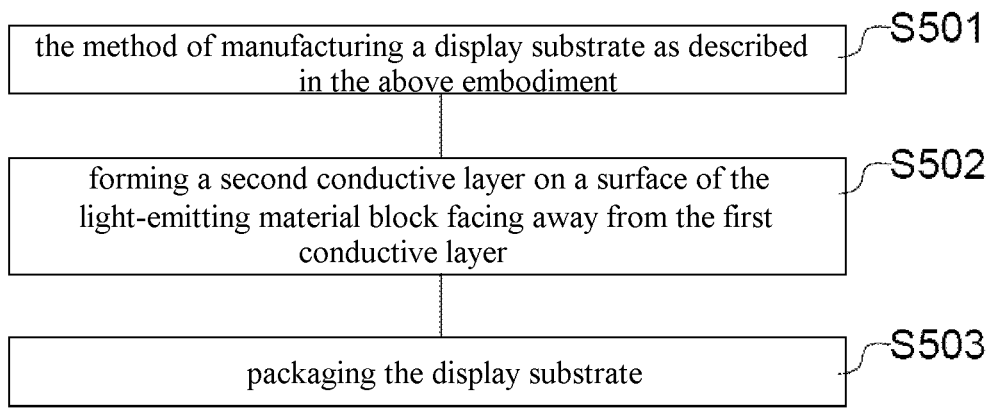
FIG. 5 illustrates a flow chart showing a method of manufacturing a display device according to an embodiment of the present invention.
Figure 6:
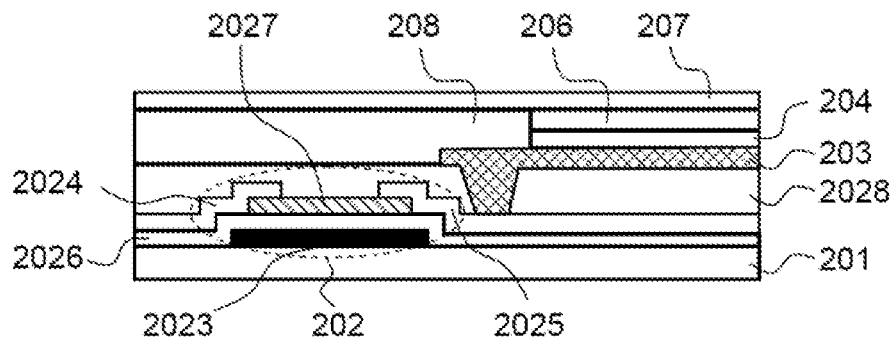
FIG. 6 illustrates a schematic structural view of a display device according to an embodiment of the present invention.

According to another aspect of the present invention, an embodiment of the present invention provides a method of manufacturing a display device. As shown in FIGS. 5 and 6, a method 500 of manufacturing a display device comprises: S501, the method of manufacturing a display substrate as described in the above embodiment; and S502, forming a second conductive layer 206 on a surface of the light-emitting material block 204 facing away from the first conductive layer 203.

In the method of manufacturing a display device according to an embodiment of the present invention, the formed light-emitting material block is transferred to the surface of the first conductive layer, so that a display substrate having a light-emitting material layer can be obtained using the base substrate on which the thin film transistor is formed without the need for a photolithographic process such as patterning, thereby saving the process steps. An adjustable voltage can be applied to the light-emitting material block via the first conductive layer and the second conductive layer, thereby achieving adjustable light emission and display.

Optionally, after forming the second conductive layer 206 on a surface of the light-emitting material block 204 facing away from the first conductive layer 203, the method 500 further comprises: S503, packaging the display substrate.

As shown in FIG. 6, the display substrate may be packaged with a material such as a transparent packaging layer 207, thereby preventing the light-emitting material block from being eroded by oxygen and water. Optionally, prior to applying the transparent packaging layer 207, a planarization layer 208 may be further applied to planarize the display substrate 200.

According to a further aspect of the present invention, an embodiment of the present invention provides a display substrate. As shown in FIG. 2e, the display substrate 200 comprises: a base substrate 201, and a plurality of gate lines 2021 and a plurality of data lines 2022 formed on the base substrate 201. The plurality of gate lines 2021 and the plurality of data line 2022 define a plurality of pixels 205, wherein each of the pixels 205 comprises a thin film transistor 202, a first conductive layer 203, and light-emitting material blocks 2041, 2042, 2043. The gate 2023 of the thin film transistor 202 is electrically connected to the gate line 2021, the source 2024 of the thin film transistor 202 is electrically connected to the data line 2022, and the drain 2025 of the thin film transistor 202 is electrically connected to the first conductive layer 203. The light-emitting material blocks 2041, 2042, 2043 are located on the surface of the first conductive layer 203.

In the prior art, since the light-emitting material is usually formed directly on the base substrate, it is difficult to obtain a light-emitting material block having desired dimension and composition due to the limitation by the process conditions such as temperature. According to embodiments of the present invention, the light-emitting material block can be formed separately so that the dimension (e.g. area, thickness) and the composition of the light-emitting material block can be adjusted as necessary without the above limitation, thereby improving the display quality.

In the method of manufacturing a display substrate, the method of manufacturing a display device, and the display substrate provided by embodiments of the present invention, the formed light-emitting material block is transferred to the surface of the first conductive layer so that a display substrate having a light-emitting material layer can be obtained using the base substrate on which the thin film transistor is formed without the need for a photolithographic process such as patterning, thereby saving the process steps. In the prior art, since the light-emitting material is usually formed directly on the base substrate, it is difficult to obtain a light-emitting material block having desired dimension and composition due to the limitation by the process conditions such as temperature. According to embodiments of the present invention, the light-emitting material block can be formed separately so that the dimension (e.g. area, thickness) and the composition of the light-emitting material block can be adjusted as necessary without the above limitation, thereby improving the display quality.

Apparently, those skilled in the art can make various modifications and variations to the present invention without departing from the spirit and scope thereof. In this way, if these modifications and variations to the present invention fall within the scope of the claims of the present invention and equivalent technologies thereof, the present invention also intends to encompass these modifications and variations.

The invention claimed is:

1. A method of manufacturing a display substrate, comprising:
   providing a base substrate;
   forming a thin film transistor on the base substrate;
   forming a first conductive layer on the base substrate on which the thin film transistor is formed, the first conductive layer being electrically connected to a drain of the thin film transistor;
   forming a light-emitting material block; and
   transferring the light-emitting material block to a surface of the first conductive layer,
   wherein said forming a light-emitting material block comprises forming a light-emitting material block on a wafer, and singulating the light-emitting material block.

2. The method according to claim 1, wherein a step of transferring the light-emitting material block to a surface of the first conductive layer comprises:
   picking up the light-emitting material block and bonding the light-emitting material block to the surface of the first conductive layer.

3. The method according to claim 2, wherein a step of bonding the light-emitting material block to the surface of the first conductive layer comprises:
   coating a conductive adhesive to a surface of the light-emitting material block or the surface of the first conductive layer and attaching the light-emitting material block to the surface of the first conductive layer.

4. The method according to claim 1, wherein the light-emitting material block includes at least a light-emitting material block for emitting red light, a light-emitting material block for emitting green light, and a light-emitting material block for emitting blue light.

5. The method according to claim 1, wherein a step of forming a thin film transistor on the base substrate comprises:
   forming a gate line and a gate on the base substrate;
   forming, on the gate line and the gate, an insulating layer, an amorphous silicon layer, a data line, a source and a drain, successively; and
   forming a passivation layer.

6. The method according to claim 1, wherein the step of forming a thin film transistor on the base substrate comprises:
   forming a data line, a source and a drain on the base substrate;
   forming, on the data line, the source and the drain, an insulating layer, an amorphous silicon layer, a gate line and a gate, successively; and
   forming a passivation layer.

7. A method of manufacturing a display device, comprising:
   providing a base substrate;
   forming a thin film transistor on the base substrate;
   forming a first conductive layer on the base substrate on which the thin film transistor is formed, the first conductive layer being electrically connected to a drain of the thin film transistor;
   forming a light-emitting material block;
   transferring the light-emitting material block to a surface of the first conductive layer; and
   forming a second conductive layer on a surface of the light-emitting material block facing away from the first conductive layer,
   wherein said forming a light-emitting material block comprises forming a light-emitting material block on a wafer, and singulating the light-emitting material block.

8. The method according to claim 7, wherein, after forming a second conductive layer on a surface of the light-emitting material block facing away from the first conductive layer, the method further comprises:
   packaging the display substrate.

9. The method according to claim 7, wherein a step of transferring the light-emitting material block to a surface of the first conductive layer comprises:
   picking up the light-emitting material block and bonding the light-emitting material block to the surface of the first conductive layer.

10. The method according to claim 9, wherein a step of bonding the light-emitting material block to the surface of the first conductive layer comprises:
    coating a conductive adhesive to a surface of the light-emitting material block or the surface of the first conductive layer and attaching the light-emitting material block to the surface of the first conductive layer.

11. The method according to claim 7, wherein the light-emitting material block includes at least a light-emitting material block for emitting red light, a light-emitting material block for emitting green light, and a light-emitting material block for emitting blue light.

12. The method according to claim 7, wherein a step of forming a thin film transistor on the base substrate comprises:
    forming a gate line and a gate on the base substrate;
    forming, on the gate line and the gate, an insulating layer, an amorphous silicon layer, a data line, a source and a drain, successively; and
    forming a passivation layer.

13. The method according to claim 7, wherein the step of forming a thin film transistor on the base substrate comprises:
    forming a data line, a source and a drain on the base substrate;

forming, on the data line, the source and the drain, an insulating layer, an amorphous silicon layer, a gate line and a gate, successively; and forming a passivation layer.

* * * * *